United States Patent
Solak et al.

(10) Patent No.: US 10,025,197 B2
(45) Date of Patent: Jul. 17, 2018

(54) METHOD FOR PRINTING COLOUR IMAGES

(71) Applicant: EULITHA A.G., Kirchdorf (CH)

(72) Inventors: Harun H. Solak, Brugg (CH); Christian Dais, Rheinfelden (CH); Francis Clube, Windisch (CH)

(73) Assignee: Eulitha A.G., Kirchdorf (CH)

( * ) Notice: Subject to any disclaimer, the term of this patent is extended or adjusted under 35 U.S.C. 154(b) by 0 days.

(21) Appl. No.: 15/538,948

(22) PCT Filed: Dec. 18, 2015

(86) PCT No.: PCT/IB2015/059790
§ 371 (c)(1),
(2) Date: Jun. 22, 2017

(87) PCT Pub. No.: WO2016/103132
PCT Pub. Date: Jun. 30, 2016

(65) Prior Publication Data
US 2017/0363968 A1    Dec. 21, 2017

Related U.S. Application Data

(60) Provisional application No. 62/095,180, filed on Dec. 22, 2014.

(51) Int. Cl.
*G03B 27/44* (2006.01)
*G03B 27/32* (2006.01)
(Continued)

(52) U.S. Cl.
CPC ........ *G03F 7/70466* (2013.01); *G03F 7/0007* (2013.01); *G03F 7/7045* (2013.01); *G03F 7/70408* (2013.01); *G03F 7/70558* (2013.01)

(58) Field of Classification Search
CPC .. G03F 7/0007; G03F 7/0005; G03F 7/70466; G03F 7/70325; G03F 7/70375;
(Continued)

(56) References Cited

U.S. PATENT DOCUMENTS 8,525,973 B2    9/2013   Solak et al.
2002/0031725 A1*  3/2002   Sugita .................. G03F 7/2022
                                                      430/311
(Continued)

FOREIGN PATENT DOCUMENTS

WO       2013039454 A1    3/2013

OTHER PUBLICATIONS

Jeppe S. Clausen et al, "Plasmonic Metasurfaces for Coloration of Plastic Consumer Products", Nano Letters, US, vol. 14, No. 8, Aug. 13, 2014 (Aug. 13, 2014), pp. 4499-4504, XP055273964.
(Continued)

*Primary Examiner* — Christina Riddle
(74) *Attorney, Agent, or Firm* — Laurence Greenberg; Werner Stemer; Ralph Locher

(57) ABSTRACT

A method forms a pattern of metallic nanofeatures that generates by plasmonic resonance a desired image having a distribution of colors. The method includes providing a substrate having a layer of photosensitive material, exposing the layer to a high-resolution periodic pattern of dose distribution, and determining a low-resolution pattern of dose distribution such that the sum of the low-resolution pattern and the high-resolution periodic pattern of dose distribution is suitable for forming the pattern of metallic nanofeatures. The lateral dimensions of the metallic nanofeatures have a spatial variation across the pattern that corresponds to the distribution of colors in the desired image. The layer of photosensitive material is exposed to the low-resolution pattern of dose distribution. The layer of
(Continued)

photosensitive material is developed to produce a pattern of nanostructures in the developed photosensitive material. The pattern of nanostructures is processed so that the pattern of metallic nanofeatures is formed.

20 Claims, 5 Drawing Sheets

(51) Int. Cl.
*G03F 7/20* (2006.01)
*G03F 7/00* (2006.01)

(58) Field of Classification Search
CPC .. G03F 7/70383; G03F 7/70391; G03F 7/704; G03F 7/70408; G03F 7/70558; G03F 7/7045
USPC ...... 355/46, 52, 53, 55, 67–71, 77; 430/5, 7, 430/311–316, 357, 394, 363, 364, 365, 430/367; 250/492.1, 492.2, 492.22, 250/493.1, 548; 438/22, 28, 29, 30, 34, 438/69–72
See application file for complete search history.

(56) References Cited

U.S. PATENT DOCUMENTS

2008/0186579 A1 8/2008 Solak
2009/0117491 A1 5/2009 Hendel et al.

OTHER PUBLICATIONS

Wei Wu et al, "A Novel Self-aligned and Maskless Process for Formation of Highly Uniform Arrays of Nanoholes and Nanopillars", Nanoscale Research Letters, US, vol. 11, No. 3, Mar. 1, 2008 (Mar. 1, 2008), pp. 123-127, XP055274962.

Karthik Kumar et al, "Printing colour at the optical diffraction limit", Nature Nanotechnology, GB, vol. 7, No. 9, Aug. 12, 2012 (Aug. 12, 2012), pp. 557-561, XP055273968.

D. Inoue et al., "Polarization independent visible color filter comprising an aluminum film with surface-plasmon enhanced transmission through a subwavelength array of holes", Applied Physics Letters, (2011), vol. 98, pp. 093113-1-093113-3.

J-H. Seo et al., "Nanopatterning by laser interference lithography: applications to optical devices", J. Nanosci. Nanotechnol., (2014), vol. 14, No. 2, pp. 1521-1532.

* cited by examiner

Mask 1

Mask 2

Four colored regions

METHOD FOR PRINTING COLOUR IMAGES

BACKGROUND OF THE INVENTION

Field of the Invention

The current invention relates generally to the production of colour images for such applications as displays and anti-counterfeiting, and in particular to the photolithographic fabrication of metallic nanostructures that transmit or reflect colour by plasmonic resonance.

In today's colour printers, colours are rendered by colour dyes that are deposited onto different positions on a substrate such as paper. In such a system, a range of colours is achieved by combining two or more colour dyes in different proportions. Colour printers have mechanical and/or optical systems that can position dyes accurately to achieve colour pixel sizes as small as several microns. However, the need for more than one material to be deposited requires reservoirs of the various colour dyes, in the form of cartridges. Furthermore, the colours achieved by mixing dyes of fixed light-absorption wavelengths are not as spectrally pure as those achieved by tuning the absorption wavelengths of materials, which could produce colours more vibrant to the eye. Finally, the resolution of the images produced is limited to the smallest amount of dye that can be deposited onto the substrate, typically microns in size. Industrial techniques such as inkjet and laserjet methods print at sub-10,000 d.p.i. resolutions because of their micrometer-sized ink spots. Research-grade methods are capable of dispensing dyes at higher resolution but are serial in nature and, to date, only monochrome images have been demonstrated. Plasmon resonances in metal nanostructures have been used to create colours in stained glasses since the 4th century AD. Plasmon resonances in metal films have also been used in macroscopic colour holograms, full colour filters and polarizers. The colour filters in particular exhibit the phenomenon of extraordinary optical transmission (EOT) and effect of Fano resonance through periodic subwavelength holes in the film. The colours produced are set by the periodicity of the structures, which are typically in the range 100-1000 nm, so multiple repeat units are required, resulting in relatively large, micrometer-sized pixels. In an alternative arrangement, small (tens of nanometers) isolated metal nanoparticles can be used, which scatter colours depending on their shapes and sizes, but do not scatter strongly enough to be viewed plainly in a microscope, especially when deposited in direct contact with a substrate.

Colour micro-images based on plasmon resonances are described in the prior art. For example, an aluminium film patterned with arrays of nanoholes is viewed in transmission using grazing angle dark-field microscopy and depending on the geometry of each array, different colours are observed (D. Inoue et al, "Polarization independent visible color filter comprising an aluminum film with surface-plasmon enhanced transmission through a subwavelength array of holes", Applied Physics Letters 98, 093113 (2011)).

A method has recently been demonstrated for printing full-colour images at the optical diffraction limit by encoding colour information into silver or gold nanodisks formed on the tops of nanopillars above a back-reflector (Kumar et al., "Printing colour at the optical diffraction limit", Nature nanotechnology, Vol. 7, pp. 557-561 (2012)). Electron beam lithography is first employed to write an array of nanoposts into a layer of negative-tone hydrogen silsesquioxane resist on a silicon substrate. The electron beam is used to define the diameters and separations of the nanoposts across the array so that the desired variation of colour is produced in the image. A 1 nm-thick chromium adhesion layer, a 15 nm-thick layer of silver or gold and finally a 5 nm-thick capping layer of gold are successively deposited onto the tops of the posts and onto the surface of the substrate. The coating on the latter acts as a back-reflector, which improves the efficiency of colour generation.

The different sizes and separations of the silver or gold nanodisks thus formed determine the interplay of plasmon and Fano resonances, and consequently the resulting colour. The images can be viewed in reflection under a bright-field optical microscope. It is additionally disclosed that the colours are preserved when only four nanodisks are present in each 250×250 nm pixel, thus enabling colour printing at a resolution of 100,000 dots per inch (DPI).

In another fabrication procedure a master mold comprising an array of nanoholes in silicon is first formed using electron beam lithography (Clausen et al., "Plasmonic metasurfaces for coloration of plastic consumer products", Nano-letters, Vol. 14, pp. 4499-4504 (2014)). The sizes and distribution of the holes in the array are defined using the electron beam so that they correspond to the arrangement of colours in the desired image. The mold is then employed in a hot-embossing or an injection molding process to produce an array of nanopillars in a polymer material. An aluminium layer is subsequently deposited on the structure to form nanodisks on the tops of the pillars and a reflective layer around the pillars, and then a transparent protective layer is coated over the complete structure. It is described that the complete spectrum of colours may be produced by varying just the diameter of the nanodisks, without changing the array period. Using this procedure many replicas of the nanopillar structure may be formed in the polymer material from the master mold, and then aluminium deposited on the replicas simultaneously, thereby enabling a relatively low cost process for mass producing a particular image composed of array of metallic nanostructures.

The above prior art describes methods for fabricating metallic nanostructures that generate colour images by the mechanism of plasmonic resonance. The encoding of the different colours in the sizes and separations of the metallic nanodisks, however, rely on the expensive technique of electron-beam lithography. Whereas this is not necessarily a problem for mass producing a particular colour image that is not too large, when an embossing or injection molding process may be used to reproduce a nanopillar array, it does, however, represent a severe problem for producing different colour images on a commercial basis if only one or a small number of each are required. This would generally be the case for, for example, security applications. Also, if the required image size is large, such as 10 cm×10 cm or 50 cm×50 cm, then the cost for producing a master mask using electron-beam lithography can be prohibitively large.

Plasmonic resonance is also being investigated for other fields, for example, colour filters for OLED displays and CMOS image sensors. For these applications large arrays of metallic nanostructures are similarly needed that have to be formed very uniformly over the filter area. To achieve this in a cost-effective way, holographic interference lithography has been employed to form firstly uniform arrays of nanoholes in photoresist layers on aluminium-coated substrates (J-H. Seo et al., "Nanopatterning by laser interference lithography: applications to optical devices", J. Nanosci. Nanotechnol., Vol. 14(2), pp. 1521-32 (2014)). In this procedure, a two-beam interference system exposes the photoresist to a 1-D line-space pattern in a first exposure, the substrate is then rotated by 90°, and the 1D pattern exposed again on top of and orthogonal to the first exposure. The superposition of the two exposures produces the desired two-dimensional array of holes in the developed photoresist. The structure is then etched to transfer the pattern into the underlying aluminium. The colour of the resulting filter is determined by the diameter of the holes, which may be enlarged or reduced by adjusting the dose of the combined exposure. Whereas this exposure technique is suitable for fabricating colour filters, it is totally unsuitable for producing colour images because of the lack of control available for adjusting the relative sizes or separations of the nanostructures in different pixels for obtaining the required colour variations across the image.

SUMMARY OF THE INVENTION

The object of the present invention, therefore, is to provide a cost-effective method and apparatus for forming arrays of metallic nanostructures that generate colour images by the mechanism of plasmon resonance, whereby different images may be obtained at significantly lower cost than is achievable using the teaching of the prior art.

According to a first aspect of the present invention, a method is provided for forming a pattern of metallic nanofeatures that generates by plasmonic resonance a desired image having a distribution of colours, which method includes:
 a) providing a substrate having a layer of photosensitive material;
 b) exposing the layer to a high-resolution periodic pattern of dose distribution;
 c) determining at least one low-resolution pattern of dose distribution such that the sum of the at least one low-resolution pattern of dose distribution and the high-resolution periodic pattern of dose distribution is suitable for forming the pattern of metallic nanofeatures, wherein the lateral dimensions of said metallic nanofeatures have a spatial variation across the pattern that corresponds to the distribution of colours in the desired image;
 d) exposing the layer of photosensitive material to said at least one low-resolution pattern of dose distribution;
 e) developing the layer of photosensitive material to produce a pattern of nanostructures in the developed photosensitive material;
 f) processing the pattern of nanostructures so that the pattern of metallic nanofeatures is formed with said spatial variation of lateral dimension across the pattern that corresponds to the distribution of colours in the desired image.

The layer of photosensitive material on the substrate may either be arranged directly on the surface of the substrate material or, alternatively, indirectly with an intermediate layer of another material such as a metal, or intermediate layers of different materials, between the two.

The high-resolution periodic pattern of dose distribution is preferably suitable for forming an array with a square symmetry, though may have another symmetry such as hexagonal or rectangular. Advantageously, the high-resolution periodic pattern is suitable for forming an array of nanoholes or nanopillars in the photosensitive material. The shape of the nanoholes or nanopillars (as viewed from above the layer of photosensitive material) is preferably circular though may alternatively be square, triangular, elongated or some other shape, and the sidewalls of the nanoholes or nanopillars are preferably vertical.

The exposure of the high-resolution periodic pattern of dose distribution is obtained using a suitable photolithographic technique of the prior art such as interference lithography, displacement Talbot lithography, achromatic Talbot lithography, or projection photolithography. The high-resolution periodic pattern of dose distribution may be obtained using a single exposure or, alternatively, two or more exposures. The period of the high-resolution pattern is preferably in the range 50 nm-1000 nm. The exposure of the layer to the at least lower-resolution pattern of dose distribution modulates the uniformity of the high-resolution periodic pattern so that the additional level(s) of exposure dose in the regions defined by the lower-resolution pattern(s) correspond to the different colored regions in the desired image. The low-resolution pattern(s) of dose distribution is/are determined preferably from, firstly, a previous experimental and/or theoretical characterisation of the dependence of the size of the final metallic nanostructures on the level of exposure dose that is obtained using a particular post-exposure processing; secondly, a previous experimental and/or theoretical characterisation of the dependence of the resulting colour generated on the size of the metallic nonostructures; and, thirdly, a mapping of the distribution of colours in the desired image.

The pattern of nanostructures produced in the photosensitive layer may be a pattern of nanopillars or a pattern of nanoholes. If the former, the processing of the pattern may comprise, for example, an etching to transfer the pattern into the underlying substrate material and then depositing a layer of metal over the resulting pattern so that a pattern of metal nanodisks is formed on the tops of the nanopillars of the substrate material and a continuous metal layer is formed on the substrate around the bases of the nanopillars. Because of the exposure to the at least one low-resolution pattern of exposure dose, the lateral dimensions of the metallic nanodisks have a spatial variation across the pattern that corresponds to the distribution of colours in the desired image. The metal layer formed around the pillars, though not essential to the invention, acts as a back-reflector and enhances the brightness of the desired image.

If the pattern of nanostructures formed in the photosensitive layer is instead a pattern of nanoholes and the photosensitive layer is directly on the substrate surface, the processing of the pattern may comprise, for example, depositing a metal layer over the structure and then performing a lift-off process to remove the metal-coated photoresist to leave a pattern of metallic nanodisks on the substrate surface. The spatial variation of the lateral dimension of the resulting metallic nanodisks across the pattern corresponds to the distribution of colours in the desired image. Alternatively, if the pattern of nanoholes is formed in the photosensitive layer and there is an intermediate layer of metal between the it and the substrate, then an etching process may be used to transfer the pattern of nanoholes into the metal layer and subsequently a stripping process employed to remove the remaining photoresist.

Many other processing strategies may be employed for processing the pattern of nanostructures so that a corresponding pattern of nanofeatures is formed in a metal layer, whereby said nanofeatures have a spatial variation of lateral dimension that corresponds to the distribution of colours in the desired image.

A recommended sequence of procedural steps according to the present invention is illustrated in FIG. 1. It should be understood that the order of the steps for exposing the high-resolution periodic pattern and for exposing the at least one low-resolution pattern may be interchanged from that illustrated in the figure. The lateral dimension of the nanofeatures formed at a particular location in the photosensitive layer depends on the total dose received from the different exposures, and not on the order in which the exposures to the high-resolution and low-resolution patterns are performed.

BRIEF DESCRIPTION OF THE SEVERAL VIEWS OF THE DRAWING

Preferred examples of the present invention are described hereafter with reference to the following figures.

DESCRIPTION OF THE INVENTION

Figure 1:
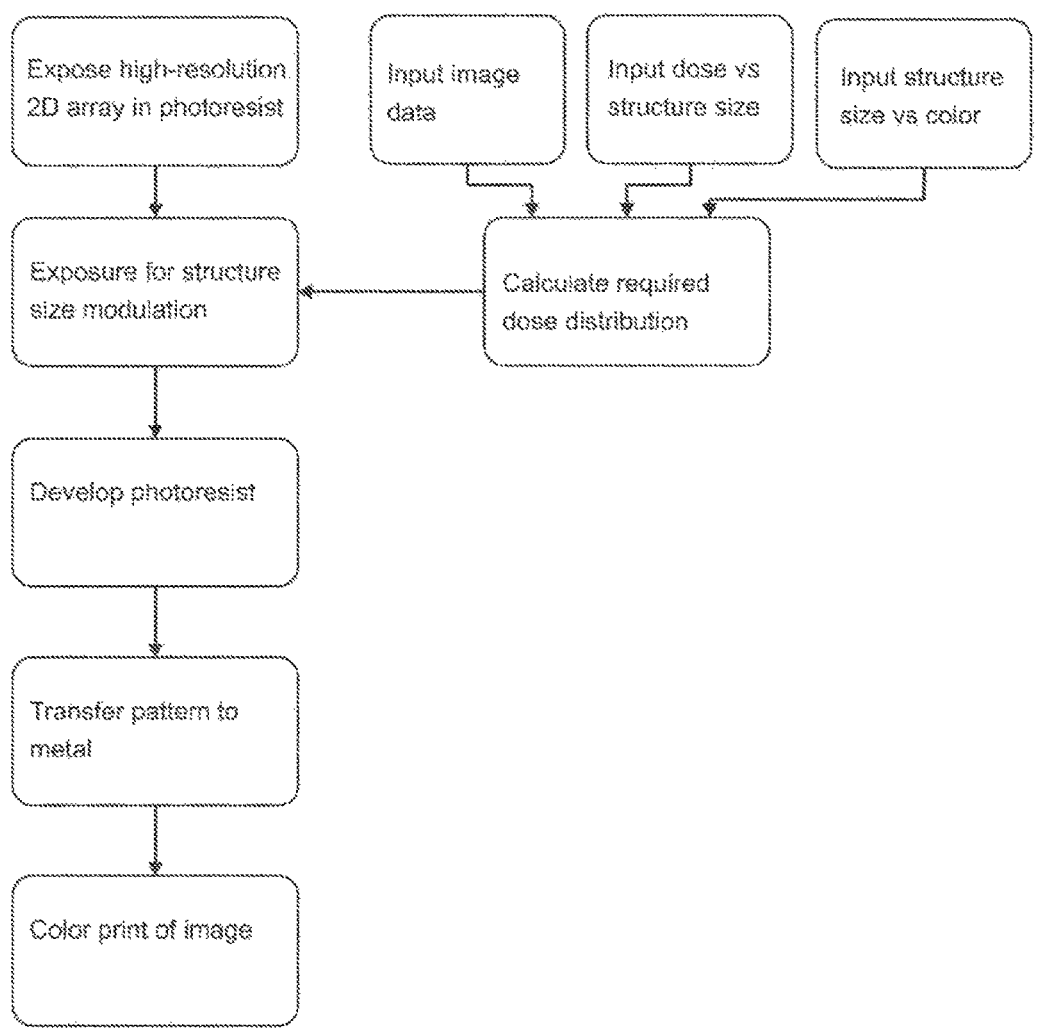
FIG. 1 illustrates a sequence of procedural steps according to the present invention.
Figure 2A:
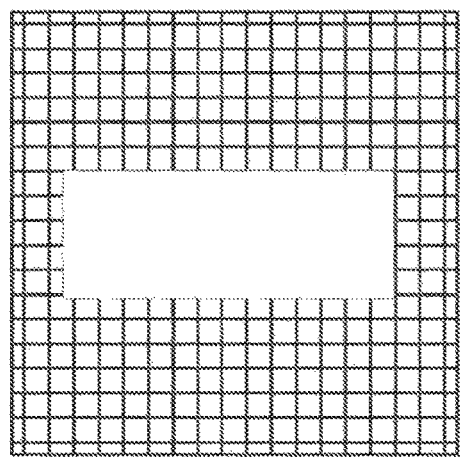
FIGS. 2a and 2b illustrate small areas of low-resolution patterns in two chrome masks that are used in a first embodiment for exposing a region of a photosensitive layer.
Figure 2B:
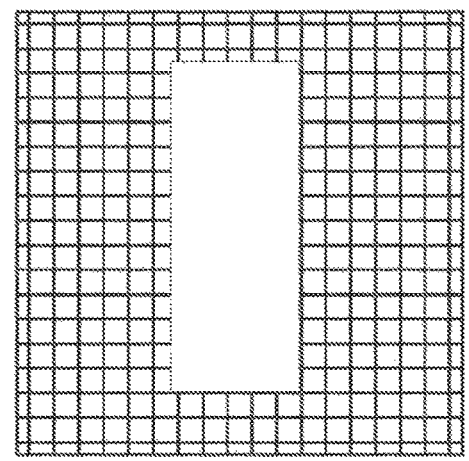

In a first step of a first embodiment, a 0.2 µm-thick layer of positive-tone photoresist on a fused-silica substrate is exposed to an intensity distribution for forming a high-resolution periodic pattern of pillars on a square lattice with a period of 300 nm. This is accomplished using the exposure technique of displacement Talbot lithography (DTL) which is known in the prior art for photolithographic exposure of periodic patterns (see, for example, U.S. patent Ser. Nos. 11/665,323 and 13/035,012). Specifically, a phase-shift mask of a linear grating with a period of 600 nm is illuminated by a beam of collimated light with substantially uniform intensity and a wavelength of 363.8 nm (derived from an argon laser) and, during the exposure, the separation between the mask and wafer is varied by the Talbot distance. A latent image of a linear grating pattern with a period half of that of the mask grating is thereby recorded in the photoresist layer. The wafer (or alternatively the mask) is then rotated by 90 degrees and the DTL exposure is repeated, so that the latent image formed by two high-resolution exposures is a square array of maxima with a period of 300 nm. If developed immediately an essentially uniform pattern of nanopillars of photoresist would be formed with a diameter of approximately 150 nm. The photoresist layer is instead further exposed to two low-resolution patterns of dose distribution. These exposures are performed using a conventional proximity or contact mask-aligner and two binary chrome masks whose patterns of opaque and clear regions have been designed based on the desired image. An exemplary small area of the pattern in "Mask 1" in illustrated in FIG. 2a, in which the cross-hatched areas represent chrome and the white areas are openings in the chrome, and an exemplary small area in "Mask 2" is illustrated in FIG. 2b. The minimum feature size employed in the two masks is 4 µm, although in general the minimum feature size employed in the masks is in the range 1-100 µm.

Figure 2C:
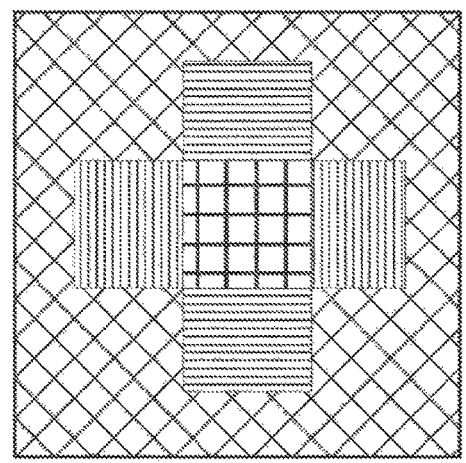
FIG. 2c illustrates the distribution of total dose exposing the region that is produced using the two masks.

Low-resolution Mask 1 is brought into proximity with the photoresist-coated substrate and aligned with respect to the latent image of the periodic pattern on the wafer using reference marks previously formed on the wafer, alignment marks included in the mask (not shown in the figures) and an alignment microscope system (which is generally available on contact/proximity mask aligners). The mask is then exposed with a certain dose to modify the size of the features in the exposed regions by a desired amount. Mask 1 is then replaced with Mask 2 and the latter is similarly brought into proximity with the photoresist and aligned using reference alignment marks on the wafer (preferably printed from Mask 1) and alignment marks included in Mask 2 (not shown in the figures). This mask is then exposed with a certain dose to modify the size of the features in the exposed regions by another desired amount. By using different doses for exposing Masks 1 and 2, the distribution of integrated dose from two exposures is as illustrated in FIG. 2c, wherein the different types of cross-hatching represent different levels of integrated dose. If, for example, the exposure doses employed for exposing Masks 1 and 2 are respectively 1 mJ/cm$^2$ and 2 mJ/cm$^2$, the four different levels of exposure dose that can be produced in the integrated distribution are respectively: 0, 1, 2 and 3 mJ/cm$^2$. If, on the other hand, the dose levels employed for the two exposures are the same, for example, 1 mJ/cm$^2$, then only three different dose levels would be possible: 0, 1 and 2 mJ/cm$^2$.

Figure 6:
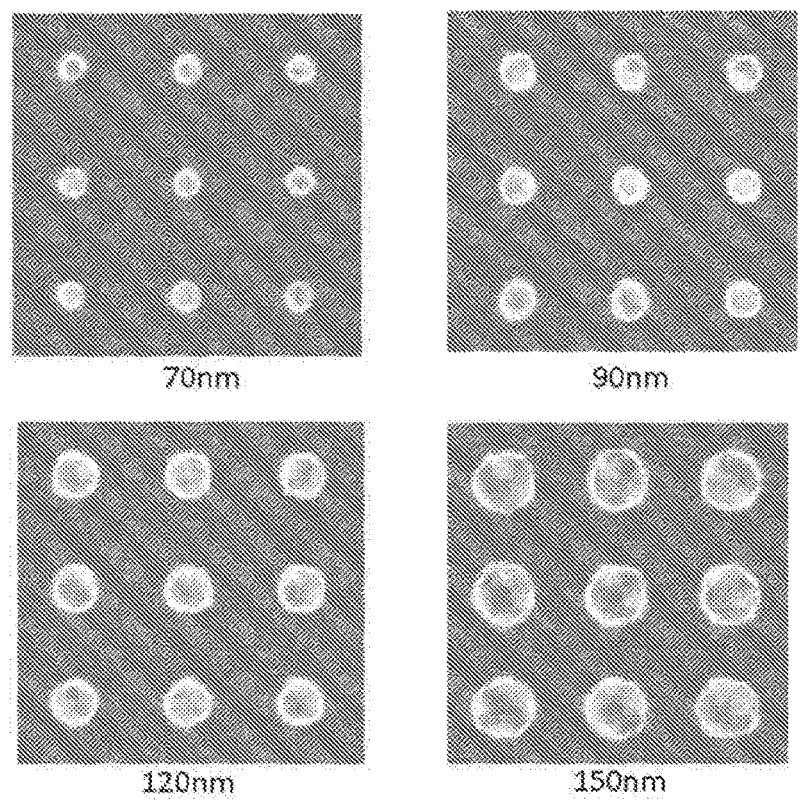
FIG. 6 shows scanning electron micrographs of metallic nanodisks formed on fused silica pillars produced in the first embodiment using four different levels of exposure dose in the low-resolution pattern.

The photoresist is then developed to form a pattern of nanopillars of photoresist on the substrate, the lateral dimension of the nanopillars at a particular location in the pattern being dependent on the sum of the high-resolution and low-resolutions patterns of exposure dose at the location concerned. Following the photoresist development, the pattern of nanopillars is etched using an reactive ion etching (RIE) process to transfer the pattern into the underlying fused-silica substrate material to form nanopillars of height ~90 nm. The parameters of the etch process are selected according to standard principles well-known to those skilled in the art of RIE. Finally, a layer of aluminium of thickness 20 nm is deposited over the complete structure to form islands of aluminium on the tops of the nanopillars and a continuous layer of aluminium around the bases of the nanopillars. The lateral dimension of each aluminium island is substantially the same as the lateral dimension of the nanopillar on which it is formed. The lateral dimension of the metallic islands therefore varies spatially over the pattern according to the sum of the high-resolution and low-resolution patterns of dose distribution. FIG. 6 shows scanning electron micrograph images of aluminium islands with four different lateral dimensions of respectively 70, 90, 120 and 150 nm that are formed on the tops of the 90 nm-high nanopillars etched in fused silica. The four dimensions were produced by the four different levels of combined exposure dose obtained using the Mask 1 and Mask 2 patterns.

Viewing the processed structure in reflection produces the distribution of colours required in the desired image by the mechanism of plasmonic resonance. The layer of aluminium formed around the bases of nanopillars acts as a reflector and so enhances the brightness of the resulting image, and also modifies the colour, which needs to be taken into account in the determination of the low-resolution patterns of dose distribution.

Figure 3:
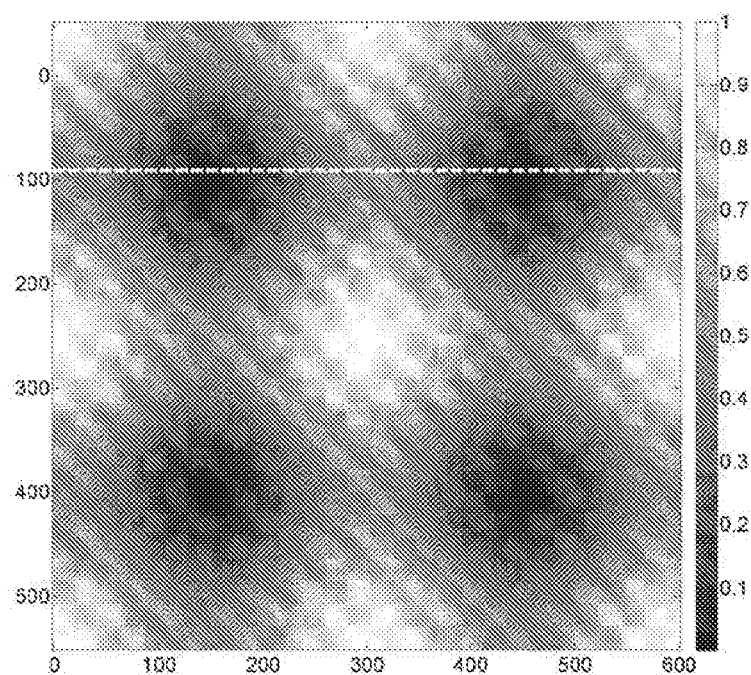
FIG. 3 illustrates an integrated exposure dose produced at the photosensitive layer in the first embodiment by a high-resolution periodic distribution.
Figure 4:
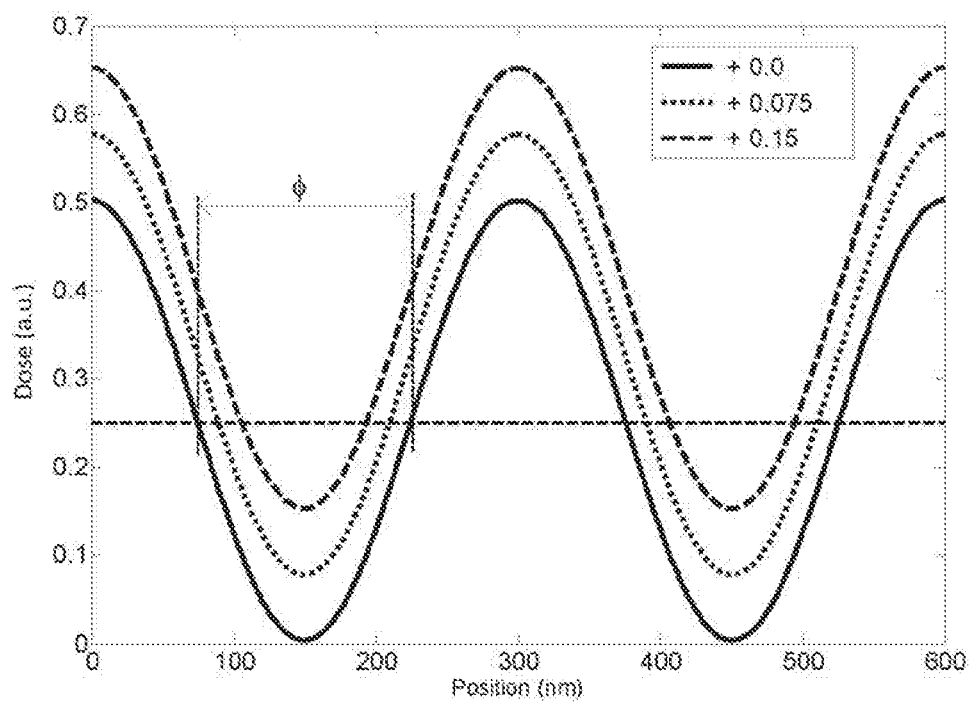
FIG. 4 illustrates the variation of dose distribution across the dashed line indicated in FIG. 3 and also the variations of dose distribution obtained by additionally exposing the layer to two different levels of dose in a low-resolution pattern of dose distribution, and also the resulting diameters φ of the nanopillars respectively formed in the developed photoresist.
Figure 5:
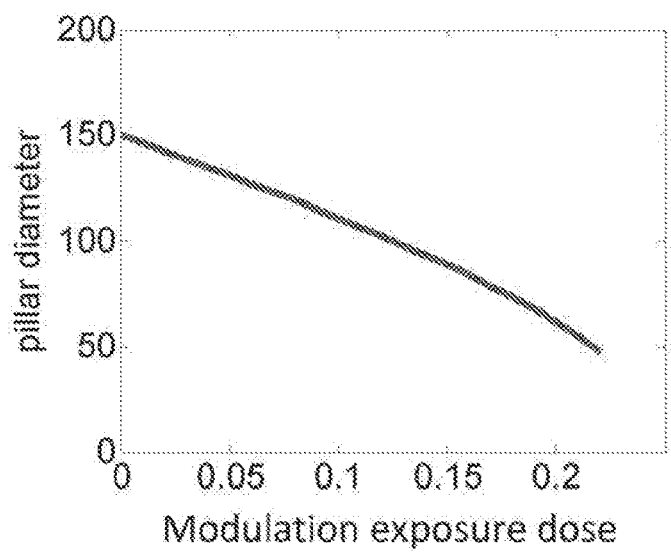
FIG. 5 illustrates the dependence of the diameter of the nanopillars formed in photoresist in the first embodiment on the relative level of exposure dose in the low-resolution pattern.

The values of the certain doses employed for exposing Masks 1 and 2, and also the design of Masks 1 and 2, depend firstly on the dose distribution of the high-resolution periodic pattern produced by the two orthogonal exposures of the line-space pattern. The spatial variation of dose produced by the sum of these two exposures over an area of 2×2 high-resolution features in the resulting square array is illustrated in FIG. 3, and the intensity variation along an axis of this pattern (indicated by the dashed line in the FIG. 3) is shown as the bold curve in FIG. 4. The diameter, $\phi$, of the resulting nanopillars formed in the photoresist may be estimated from the level of dose required to fully clear the photoresist after development, as is illustrated in FIG. 4 for a dose-to-clear value of 0.25 a.u. (arbitrary units). The figure shows also the effect of adding two different levels of locally uniform dose distribution (0.075 a.u. and 0.15 a.u. respectively) to the dose distribution of the square array, as would be produced by additionally exposing the photosensitive layer to a low-resolution pattern of dose distribution. The combined doses of the low-resolution and high-resolution patterns for the two different levels are indicated by the dashed curves. The dependence of diameter of the nanopillars formed in the photoresist on the relative dose of the low-resolution exposures may therefore be determined from the intersections of the set of curves shown in FIG. 4 with the horizontal dashed line: the result is illustrated in FIG. 5. The dependence of the diameter of the aluminium islands in the fully processed pattern may also be theoretically derived or, alternatively, experimentally determined from, for example, SEM images of the fully processed pattern of metallic nanofeatures.

The dose distributions required from the low-resolution exposures depend also on the dependence of the colour generated at a particular viewing angle of the resulting plasmonic array on the diameter of the metal islands. This may be characterised experimentally by, for instance, spectroscopic measurement of the light reflected from the particular geometries and composition of the nanostructures concerned, or simply from the perceived colour. Because the colour generated depends also on other parameters such as the thickness of the metal islands and the height of the pillars, it is important that these other parameters are controlled and have substantially the same values during the characterisation of the dependence of colour on the island diameter as during the formation of the pattern of metallic nanostructures for generating the colour image. Typically, the different levels of integrated dose produced by the combination of the high-resolution and low-resolution exposures preferably produce nanopillars in the developed photoresist/metal islands with diameters in the range 50-140 nm, so that many different colours may be observed in the final image.

The dose distributions required from the low-resolution exposures depend lastly on the arrangement of colours and intensities thereof in the desired image. This may be mapped in terms of the colours available from the metallic nanostructures to be formed which have particular values of diameter. A higher or lower intensity of colour at a particular region of the image may be obtained by adjusting the number of the metal islands with the appropriate diameter in the particular region of the image.

The results of the above-described characterisation and mapping procedures allow the low-resolution patterns of dose distribution needed for generating the desired image to be determined.

In variants of this embodiment, the steps of aligning the mask 1 with the high-resolution period pattern previously printed on the substrate and aligning the mask 2 with the pattern substrate printed on the substrate from mask 1 may be performed using a coarser alignment method than by alignment microscope, for example by just mechanical means. In fact, accurate alignment of the low-resolution patterns with respect to the high-resolution periodic pattern is not usually necessary, but may be performed.

In a variant of the above embodiment, the latent image produced by the high-resolution exposure step does not have high enough dose to, by itself, yield an array of nanopillars in the photoresist (if developed immediately). It is only the addition of the low-resolution patterns of dose distribution of the subsequent exposures that enables the nanopillars to be formed in the developed photoresist.

In another variant of the above embodiment, the high-resolution periodic pattern is formed using instead a version of DTL in which the separation between the mask and substrate is changed by a distance larger than the Talbot distance and the rate of change of separation is varied during the change of separation such that the rate of change of exposure dose with separation varies according to a substantially Gaussian, or similar, profile, i.e. in a manner as described in U.S. patent Ser. No. 13/035,012.

In another variant of the above embodiment, the metal layer is deposited directly on the pattern of nanopillars formed in the photoresist, thereby forming the metal islands on the tops of the photoresist nanopillars and a layer of metal around the bases of the pillars. A protective layer is preferably coated over the structure.

Whereas the above embodiment describes a relatively simple procedure in which only 2 masks with low-resolution patterns are employed to obtain 4 different feature sizes in the developed photoresist, and consequently only 4 different colours in the final image, it is clear that in other embodiments a larger number of low-resolution masks may be used to achieve a greater variety of colour.

In other embodiments of the invention, the pattern of metallic nanostructures formed on the substrate is afterwards coated with a layer of another material, such as a polymer, to act as, for example, a protective layer. Such an additional layer generally shifts the wavelengths of the reflected or transmitted light, so produces a colour shift of each of the colours generated by the pattern of metallic nanostructures. Such colour shifts need to be characterised for the particular coating process employed and then taken into account in the determination of the at least one low-resolution pattern of dose distribution for forming the pattern of metallic nanostructures required for generating the desired image.

Whereas aluminium is employed in the first embodiment for forming the pattern of metallic nanostructures, in other embodiments of the invention other metals may be employed, in particular, gold, silver and copper which are known in the prior art to be effective for producing colour images by plasmonic resonance.

In another preferred embodiment, the exposure procedure for the low-resolution patterns is performed in order to define regions, or sub-pixels, with just 3 or 4 colours that correspond to RGB (red-green-blue) or CMYK (cyan-magenta-yellow-black) respectively. As is well-known in the fields of colour printing and colour displays, arranging sub-pixels of these colours in close proximity to each other (within a pixel) enables the perception of many more colours by the human eye. The RGB sub-pixels may be arranged on, for example, a rectangular grid.

In other embodiments the high-resolution periodic pattern of dose distribution is a two-dimensional array that is achieved by a single exposure rather than by a sum of two exposures of mutually orthogonal line/space patterns For example, a high-resolution periodic pattern of dose distribution comprising high intensity features on a hexagonal, square or rhombic grid is obtained using a chrome mask defining a hexagonal array of holes, which is employed in a DTL exposure to record the high-resolution, two-dimensional array in the photoresist. Achromatic Talbot lithography (ATL) may alternatively be employed with the same mask to form the same pattern in the photoresist.

In other embodiments of the invention, the high-resolution periodic pattern may be a linear grating pattern, which are also known in the prior art for producing colour by plasmonic resonance. In this case, the appearance of the image generated by the resulting metallic nanostructure may depend on the polarization of the illuminating light.

The exposure of the low-resolution pattern(s) of dose distribution may alternatively be performed using a projection lithography system, a laser or e-beam direct write system, or maskless lithography such as one based on Texas Instruments' digital light projector (DLP) technology or digital micro-mirror device. A suitable commercially-available maskless writing system for exposing the low-resolution patterns is a MPG 501 Tabletop Maskless Aligner manufactured by Heidelberg Instruments Mikrotechnik GmbH. This system is able to write features of size 1-2 µm with a speed of 50-100 mm²/minute respectively. The system is able to perform "gray scale" exposures, which provides large flexibility for writing a range of feature sizes in a single exposure. Maskless lithography systems with much higher writing speed (larger than 10'000 mm²/minute) are also available, such as Heidelberg Instruments' VPG 200 or VPG 400 systems. A maskless or direct write system would be controlled by a computer that varies the local dose delivered by the beam over low-resolution pattern so that the lateral dimensions of the nanostructures formed have a spatial variation corresponding to the distribution of colours in the desired image. A maskless system provides great flexibility so is particularly advantageous for individualising colour images for, for example, security applications.

The pattern transfer to a metal may be alternatively obtained using a lift-off process in which metal is deposited over the complete pattern of nanostructures formed in the photoresist, which may an array of nanoholes or nanopillars. The metal-coated photoresist is then removed by a suitable solvent to leave either a pattern of metal islands or a pattern of nanoholes in the metal layer on the substrate.

The pattern of metallic nanostructures obtained in the first embodiment may be alternatively obtained by exposing a photoresist layer that is coated to a substrate with an intermediate metal layer. After exposure of the high-resolution and low-resolution patterns of exposure dose and development of positive-tone photoresist, the areas of the metal film that have been cleared of photoresist are etched using preferably a dry etching process such as RIE to produce nanoholes in the metal layer, after which the remaining photoresist is stripped away. If a negative-tone photoresist is alternatively used a pattern of metallic nanoislands is formed on the substrate.

In other embodiments negative-tone and image reversal photoresists may be employed with suitable post-exposure processing to form the patterns of metallic nanostructures for generating the desired colour image. Exposing with such photoresists is advantageous for forming metallic nanopillars with a vertical or negative sidewall slope, which improves the isolation between top metal islands and a bottom metal layer.

The period of the high-resolution periodic pattern is preferably selected to be less than the wavelength of visible light (i.e. below 400 nm). Most preferably it is less than 300 nm in order to prevent different colours being generated at different viewing angles by ordinary diffraction rather than by plasmonic resonance.

The resolution, or smallest feature, required of the low-resolution pattern of dose distribution depends on the viewing conditions needed for the colour image. For viewing the image by naked eye a resolution of 300 DPI is generally sufficient though a higher resolution of, for example, 1000 DPI may be employed depending on the particular application. If each pixel of the image is divided into sub-pixels then a corresponding higher resolution is required for the low-resolution pattern.

Whereas the thickness of the aluminium layer in the first embodiment is selected to be 20 nm, it should be understood that other thicknesses may be used, particularly in the range 10-50 nm.

In other embodiments, a low-resolution pattern of dose distribution is additionally employed to completely or effectively eliminate the nanostructures in a region or regions of the pattern in order to produce a "black" or "dark" region, or alternatively a "white" or "light" region. In the former case, elimination of the nanostructures over a dark/black substrate produces a dark/black region in reflection, or the elimination of nanostructures followed by deposition of an opaque metal film results in a dark/black region in transmission. For the latter case, elimination of the nanostructures over a metal film on a transparent substrate followed by an etching to remove the photoresist-free metal produces a light/white region in transmission, or the removal of nanostructures over a reflective metal layer produces a light/white region in reflection.

In a related embodiment the substrate is initially coated with a stack of dielectric layers which reflect (or transmit) wavelengths selectively, to generate a perceived colour. Formation of the periodic nanostructures over the dielectric layers followed by the complete or effective elimination of the nanostructures in selected regions by a low-resolution pattern of dose distribution then produces the "background" colour of the coating when the regions are observed in reflection (or transmission).

The provision of dark, light or "coloured background" regions can be important for obtaining a particular desired appearance of images. In particular, it can be used for adjusting intensity when employed as padding around groups of metallic nanostructures of a certain lateral dimension that produce a particular colour, and especially in and around such nanostructures arranged in neighbouring sub-pixels that produce different colours. Analogous techniques are employed in related fields. In dye based printing, for example, half-tone or proportioned mixing of different colours, such as CMYB (cyan-magenta-yellow-black), printed in close proximity give the perception of a much wider spectrum of colours; and in electronically controlled displays, such as LCDs, the intensity levels of neighbouring sub-pixels of different colours, such as RGB (red-green-blue), are adjusted, or even turned off, to achieve the same effect.

Figure 7:
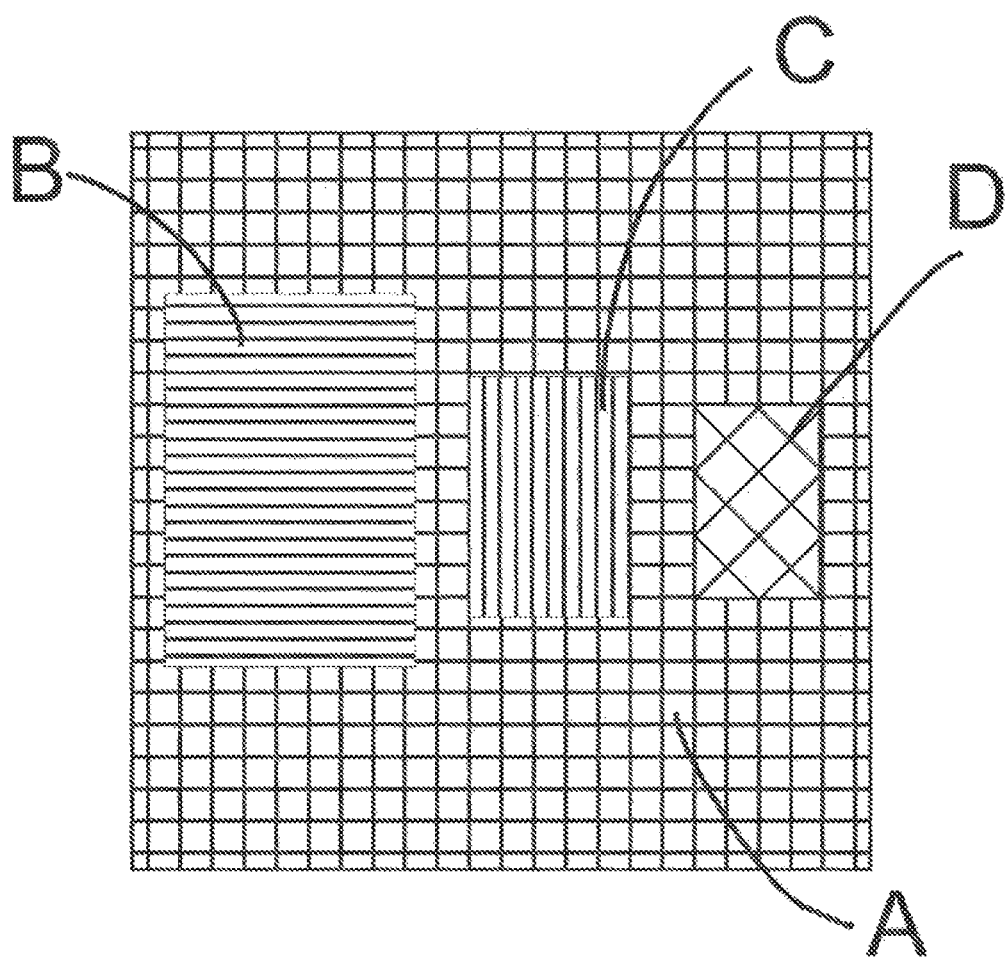
FIG. 7 illustrates a region of a pattern of metallic nanostructures on a substrate that is divided into four sub-regions A, B, C and D.

The equivalent effects may be obtained using the method of the invention by adjusting the area of nanostructures within each sub-pixel that produce a particular colour and padding the remaining area with a dark or light coloured background. Examples of how such colour mixing can be achieved are now described with reference to FIG. 7. The figure shows a region of a pattern of metallic nanostructures on a substrate that is divided into four sub-regions A, B, C and D. The lateral dimension of the metallic nanostructures within each of the sub-regions B, C and D is uniform but different between regions so that the three sub-regions generate different colour by plasmonic resonance, whereas region A is black or dark. The perceived colour of the complete region depends on the ratios of the areas of sub-regions B, C and D whereas the intensity of the perceived colour depends on the total area of the three sub-regions B, C and D.

If the image is viewed in transmission, the darkness in sub-region A may be produced by a continuous opaque metal film. This, and the metallic nanostructures in the sub-regions B, C and D, may be obtained in an embodiment of the invention by exposing the photoresist with a high-resolution periodic pattern and then with two low-resolution patterns of dose distribution that have been designed so that following development of the photoresist, no resist remains in region A, but nanoholes of appropriate lateral dimension are formed in the photoresist in each of sub-regions B, C and D; and then a metal layer is deposited on the complete structure which forms the continuous film on the substrate in region A and the metallic islands of appropriate diameters in the regions B, C and D. A lift-off process may then be used to strip off the remaining photoresist to leave the metal islands and the continuous metal film in sub-region A.

If instead the image is viewed in reflection, the darkness in sub-region A and the colours of the sub-regions B, C and D may be produced in another embodiment of this invention by exposing a photoresist layer on a substrate with an intermediate metal layer. Following exposure to the high-resolution periodic pattern, the layer is further exposed to two low-resolution patterns that are designed such that following development of the photoresist, the photoresist is completely removed from sub-region A but patterns of nanopillars of appropriate lateral dimensions are formed in each of sub-regions B, C and D. The nanostructure is then etched to remove the exposed metal layer and the remaining photoresist is subsequently stripped, to leave the patterns of metallic islands is sub-regions B, C and D and clear substrate in sub-region A which appears dark in reflected light.

In further related embodiments, sub-region A is formed without metallic nanostructures but is viewed as having a certain background colour. Such a background colour may be produced by the inherent colour of the substrate itself (either in reflection or transmission) or may be produced by continuous layers of other material, such as dielectric, deposited on either face of the substrate.

In a further relate embodiment, nanostructures are formed in sub-region A so that it produces a black background or background of a certain colour. The relative sizes of the sub-regions A, B, C and D are selected to obtain a required colour appearance.

In a yet further related embodiment, sub-region A is white or light and four different colour sub-regions are patterned on this background to achieve the appearance through mixing of other colours. One of the other colours is preferably chosen as black similar to the use of CMYK color printing on white or light surfaces.

In yet further related embodiment, each region, or pixel, of the image generated by the pattern of metallic nanostructures has five or more sub-regions that each generates light of different colours, as well as a sub-region of dark, light or coloured background.

In other embodiments of the invention, the low-resolution patterns of dose distribution are obtained using gray-level masks. Such masks enable many different levels of dose in a single exposure, so can simplify the exposure of the low-resolution pattern.

The substrate on which the pattern of metallic nanofeatures is formed may be transparent or opaque. The former allows the image to be viewed in either transmission or reflection modes, whereas the latter only allows it be viewed in reflection.

The invention claimed is:

1. A method for forming a pattern of metallic nanofeatures that generates by plasmonic resonance a desired image having a distribution of colors, which comprises the steps of:
   providing a substrate having a layer of photosensitive material;
   exposing the layer of photosensitive material to a high-resolution periodic pattern of dose distribution;
   determining at least one low-resolution pattern of dose distribution such that a sum of the at least one low-resolution pattern of dose distribution and the high-resolution periodic pattern of dose distribution is suitable for forming the pattern of metallic nanofeatures, lateral dimensions of the metallic nanofeatures having a spatial variation across the pattern of metallic nanofeatures that corresponds to a distribution of colors in the desired image;
   exposing the layer of photosensitive material to the at least one low-resolution pattern of dose distribution;
   developing the layer of photosensitive material to produce a pattern of nanostructures in a developed photosensitive material; and
   processing the pattern of nanostructures so that the pattern of metallic nanofeatures is formed with a spatial variation of lateral dimension across a pattern that corresponds to the distribution of colors in the desired image, wherein either the layer of photosensitive material is indirectly on the substrate with an intermediate metal layer, or the processing step includes depositing the metal layer.

2. The method according to claim 1, wherein the processing step forms a pattern of metal nanodisks, or a pattern of nanoholes in the metal layer.

3. The method according to claim 1, which further comprises forming the high-resolution periodic pattern of dose distribution using a method of displacement selected from the group consisting of Talbot lithography, achromatic Talbot lithography and interference lithography.

4. The method according to claim 1, which further comprises performing one of:
   placing the layer of photosensitive material directly on the substrate with at least one intermediate layer of at least one other material between the photosensitive material and the substrate; and
   placing the layer of photosensitive material indirectly on the substrate with the at least one intermediate layer of the at least one other material between the photosensitive material and the substrate.

5. The method according to claim 1, wherein a color generated in each region of the desired image is produced by the metallic nanofeatures having a single lateral dimension.

6. The method according to claim 1, wherein a color generated in each region of the desired image is produced by a plurality of neighboring sets of metallic nanofeatures, the lateral dimensions of the metallic nanofeatures within each set being a same but being different in different sets, whereby different colors generated by the plurality of sets of metallic nanofeatures mix to produce a desired color.

7. The method according to claim 1, which further comprises determining the at least low-resolution pattern of exposure dose by characterizing a dependence of color generated in the desired image on a lateral size of the metallic nanofeatures, by characterizing a dependence of the lateral size of the metallic nanofeatures on a range of exposure doses produced by the at least one low-resolution patterns, and by mapping a distribution of colors in the desired image.

8. The method according to claim 1, which further comprises performing the exposing of the layer to the at least one low-resolution periodic pattern by using maskless lithography.

9. The method according to claim 1, which further comprises performing the exposing of the layer to the at least one low-resolution periodic pattern using at least one mask.

10. The method according to claim 1, wherein the layer of photosensitive material is indirectly on the substrate with an intermediate stack of layers of at least two different dielectric materials that reflect or transmit a particular color.

11. The method according to claim 1, wherein the pattern of metallic nanofeatures includes regions without the metallic nanofeatures to act as dark, bright or colored regions in the desired image.

12. The method according to claim 1, wherein the processing of the pattern of nanostructures includes etching the pattern of nanostructures into the material of the substrate and depositing a layer of metal.

13. The method according to claim 1, wherein the layer of photosensitive material is indirectly on the substrate with an intermediate metal layer, and the processing of the pattern of nanostructures includes etching the intermediate metal layer through the pattern of nanostructures.

14. The method according to claim 1, which further comprises exposing the photosensitive layer to the high-resolution periodic pattern after the at least one low-resolution pattern.

15. The method according to claim 1, which further comprises selecting the high-resolution periodic pattern from the group consisting of a square array, a hexagonal array, a rhombic array and a linear array.

16. The method according to claim 1, wherein the processing of the pattern of nanostructures includes depositing a layer of metal directly onto the pattern of nanostructures.

17. The method according to claim 1, which further comprises forming each of the metallic nanofeatures with a circular, square, triangular or elongated shape.

18. The method according to claim 1, wherein the at least one low-resolution pattern of dose distribution is additionally employed to completely or effectively eliminate the nanostructures in a region or regions of the pattern.

19. The method according to claim 1, which further comprises exposing the layer of photosensitive material to at least two low-resolution patterns and the method additionally includes aligning the low-resolution patterns with respect to each other.

20. The method according to claim 1, wherein the exposure of the layer of photosensitive material to the high-resolution pattern of dose distribution is, by itself, insufficient to yield an array of nanopillars in a photoresist.

* * * * *